United States Patent [19]

Abramson et al.

[11] Patent Number: 5,660,693
[45] Date of Patent: Aug. 26, 1997

[54] ION VAPOUR DEPOSITION APPARATUS AND METHOD

[75] Inventors: Anthony Ian Joseph Abramson, Leeds; Norman Henry White, N. Devon; Derrick Andrew Gale, Harrogate, all of United Kingdom

[73] Assignee: Applied Vision Limited, United Kingdom

[21] Appl. No.: 492,916

[22] Filed: Jun. 20, 1995

Related U.S. Application Data

[63] Continuation of Ser. No. 90,027, filed as PCT/GB92/00071, Jan. 14, 1992.

[30] Foreign Application Priority Data

Jan. 18, 1991 [GB] United Kingdom ............... 9101106

[51] Int. Cl.$^6$ ........................................ C23C 14/34
[52] U.S. Cl. ..................... 204/192.12; 204/192.13; 204/192.15; 204/192.23; 204/192.26; 204/298.03; 204/298.07; 204/298.11; 204/298.15; 204/248.19; 204/298.23; 204/298.25; 204/298.26; 204/298.27
[58] Field of Search ............... 204/298.03, 298.07, 204/298.11, 298.15, 298.16, 298.23, 298.25, 298.26, 298.27, 298.28, 192.13, 192.15, 192.22, 192.23, 192.26, 192.27, 192.28, 292.19, 192.12

[56] References Cited

U.S. PATENT DOCUMENTS

| | | |
|---|---|---|
| 3,652,444 | 3/1972 | Lester et al. ............... 204/298.25 |
| 4,409,087 | 10/1983 | Quick ............... 204/298.03 |
| 4,420,285 | 12/1983 | Hartsough ............... 204/192.23 |
| 4,420,385 | 12/1983 | Hartsough ............... 204/192.23 |
| 4,588,942 | 5/1986 | Kitahara ............... 204/298.03 |
| 4,851,095 | 7/1989 | Scobey et al. ............... 204/192.26 |
| 4,969,790 | 11/1990 | Petz et al. ............... 204/298.25 |
| 4,984,531 | 1/1991 | Zejda ............... 204/298.28 |
| 5,124,019 | 6/1992 | Kunkel et al. ............... 204/298.15 |

FOREIGN PATENT DOCUMENTS

| | | | |
|---|---|---|---|
| 2100725 | 7/1971 | Germany ............... | 204/298.25 |
| 63-469 | 1/1988 | Japan ............... | 204/298.03 |

*Primary Examiner*—R. Bruce Breneman
*Assistant Examiner*—Rodney G. McDonald
*Attorney, Agent, or Firm*—Rohm & Monsanto

[57] ABSTRACT

Spectacle lenses are coated by ion vapor deposition by means of sputtering target materials. A plurality of lenses to be coated are introduced into a sputtering chamber by a load lock device, and when in the chamber the lenses are covered by a disc which is rotated at high speed (50/60 rpm). During this rotation alternate targets of magnetrons are sputtered releasing metal particles which are oxidized by an oxygen plasma created by a third magnetron and metallic oxide coatings are formed on the lenses as alternate layers of different materials. At the end of the operation of coating, which is pre-programmed, the lenses are returned automatically to the load lock device from whence they can be removed. After placement or the lenses in the load lock device the entire process is effected automatically by pressing a button.

5 Claims, 4 Drawing Sheets

ION VAPOUR DEPOSITION APPARATUS AND METHOD

This application is a continuation of application Ser. No. 08/090,027 filed on Jul. 16, 1993, as a Sec. 371 application of PCT/GB92/00071 filed on Jan. 14, 1992.

BACKGROUND OF THE INVENTION

1. Field of the Invention

This invention relates to ion vapour deposition (herein IVD) by sputtering and relates to a method of and apparatus for applying coatings by IVD by sputtering.

The invention relates further to the application of coatings to articles, in particular optical lenses, and also to other articles of a width to thickness aspect ratio similar to optical lenses. The invention has particular application to optical lenses of the type used in spectacle frames, and which mainly will be corrective lenses, but could be plain lenses and in the interests of clarity reference is made hereinafter only to lenses which unless the context otherwise demands, are to be understood as being spectacle lenses.

The lenses to which the invention applies may be of glass or plastics material.

2. Description of the Prior Art

The IVD sputtering process comprises the placement of an article to be coated in a chamber in which is provided a cathode target of the coating material. Negative electric bias is applied to the target, and the chamber is filled with an inert gas, such as argon. Ionisation of the gas takes place, and the gas positive ions bombard the target by virtue of being attracted thereto due to the negative electric bias on the target. Sputtering of the target takes place which is a phenomenon resulting in the release of atoms of the target material into the chamber atmosphere. These atoms are caused to impinge upon the surface of the article to be coated and may be induced to deposit on the article by virtue of an electric bias on the article or in the region of the chamber surrounding the article, and so a coating is built up. The most usual forms of sputtering apparatus (magnetrons) use magnetic fields in conjunction with the target material to enhance the sputtering process.

IVD processes are of course well established for many products, and are typically used for metallic products which require to be coated to a high degree of accuracy, and where the articles have to be used in controlled environments or in situations where the performance of the articles is critical. For example IVD coated articles such as screws, nuts and bolts may be used in the aircraft industry, in military applications, or in space vehicle applications. The prior devices use a target with one material attached to it. Therefore only one single material can be sputtered from the target.

The use of IVD for the coating of spectacle lenses is also known but the available machines for such coating require the careful monitoring by skilled personnel; they are not in common use and generally speaking an alternative process known as evaporation is used for coating the lenses. Coatings on spectacle lenses perform several functions. Firstly, a reflection control coating serves to allow as much light of wavelength in the visible range through the lens into the eye as possible, whilst reflecting as much light which is in the harmful wavelength region, such as UV light, from the eye as possible. Other IVD coatings serve to provide a hard protective surface to protect the lenses from scratching and the like.

Generally speaking, the equipment which is used for IVD coating of lenses is evaporation equipment and is large and expensive, and requires considerable investment on the part of a processor, and in commercial terms when a person orders a pair of spectacles from an optician, the optician submits the prescription to a lens manufacturer, but the lens manufacturer in turn will pass on the lenses to the IVD coating processor who will coat the lenses as required. Coating in the conventional machine can take as much as one hour.

SUMMARY OF THE INVENTION

The present invention arises out of the objective of providing IVD coatings on lenses by sputtering by means of a relatively small and inexpensive machine.

In accordance with a first aspect of the invention there is provided a sputtering apparatus for the coating of lenses by IVD comprising a shallow cylindrical chamber, a disc holder mounted for rotation in said chamber, said disc having means for receiving and holding lens holders at the periphery thereof, at least one magnetrons and target in communication with said chamber to enable the target to be sputtered, means for creating a vacuum in the chamber, and a lead lock device communicating with the chamber, said lead lock device comprising a magazine for holding lens holders with lenses therein, means for isolating the lead lock device from the chamber, means for creating a vacuum in the lead lock device, means for releasing the isolating device when the holders and lenses have been loaded into the lead lock device magazine and the vacuum has been created therein, means enabling the holders and lenses to be respectively placed in said means for receiving, and pre-programmable control means arranged to cause the machine to operate on a pre-programmed sequence after placement of the holders in the lead lock device upon actuation of switch means, to apply at least one coating to the lenses by said at least on magnetrons and target as the disc is rotated.

Preferably, there are two of said magnetrons which have targets of different materials, and the respective magnetrons are operated alternately.

One of said targets may be silicon whilst the other may be titanium. The disc may be rotated during coating at a speed in the order of 50 revs/min.

There may be a third magnetron which is arranged to be operated to establish an oxygen plasma in the chamber during the coating operations to ensure that coatings of titanium dioxide and silicon dioxide are laid down, the chamber being supplied with oxygen at different rates depending upon whether or not the titanium target or silicon target is sputtering.

In one embodiment, the chamber is typically a cylindrical chamber of dimensions in the range 75 cm diameter, and of appropriate height.

The chamber preferably has a viewing aperture by which the IVD process being performed therein can be observed.

The or each magnetron may be of the form set forth in British Patent No 1453377 with water cooling if required provided by passages therein connected for the supply and return of cooling water.

The power source may comprise a high voltage DC or radio frequency AC supply for the charging of the target material.

Appropriate connections may be provided for the delivery and exhaust of the ionising gas and the supply of oxygen.

The disc may have peripheral notches or locations each adapted to carry a holder for holding a spectacle lens, and the disc being rotatable in the chamber so that lenses held thereby can be moved past the target material in sequence and in order to ensure that the coating material is applied evenly to the lens surface. To enhance the operation, a bias potential may be applied to the disc in order to attract the coating particles during IVD and improve adhesion.

The pre-programmable control means ensures that the load lock device after insertion of the lenses and the sealing closed of same, is evacuated until the internal pressure matches that of the treatment chamber, when isolation means is released and the magazine of lenses is then lowered step by step into the chamber and at each step a lens and its holder are removed from the magazine and carried by the disc. When all lenses have been received on the disc, the disc is then rotated at relatively high speed, in the order of 50/60 rpm whilst the sequential sputtering to be described hereinafter takes place.

The IVD can be further enhanced by providing inside the treatment chamber a filament and cathode which are appropriately biased.

The target material magnetrons are arranged spaced and opposite in the chamber, each holding a target material, the sputtering surfaces of the materials, which surfaces are flat, being in the same plane.

The control means may comprise a crystal oscillator of which the crystal is located in the chamber adjacent the target materials to detect the rate of sputtering thereby to determine the period during which sputtering should take place to achieve the predetermined build-up of coating on the articles. The control means is programmed to cause the application of alternate, predetermined thickness layers of the target materials to the articles.

In a further aspect there is provided a method of sputter coating lenses wherein the lenses are loaded in holders into a load lock device which is isolated from a sputtering chamber containing a disc on which the holders are to be placed, creating a vacuum in said chamber, creating a vacuum in said load lock device, connecting the load lock device with said chamber when the said vacuums match, placing the holders and lenses on said disc, rotating the disc whilst sputtering a target which faces into the chamber to cause a coating of the target material to deposit on said lenses, stopping the sputtering, returning the holders and coated lenses to the load lock device, isolating the device from the chamber and removing the holders and lenses from the load lock device.

The various constructional features enable the machine of each embodiment to provide coatings on lenses in a convenient and simple manner, and such machines can be utilised on a "do-it-yourself" basis by lens manufacturers which means that lenses can be manufactured for use in a shorter time, and the lens manufacturers do not have the inconvenience of having to sub-contract the coating operation. The operation is deskilled compared to the evaporation technique, and each operation can be started simply by pressing a button; the coating process stops automatically.

BRIEF DESCRIPTION OF THE DRAWING

Embodiments of the invention will now be described, by way of example, with reference to the accompanying diagrammatic drawings, wherein.

DETAILED DESCRIPTION

Figure 2:
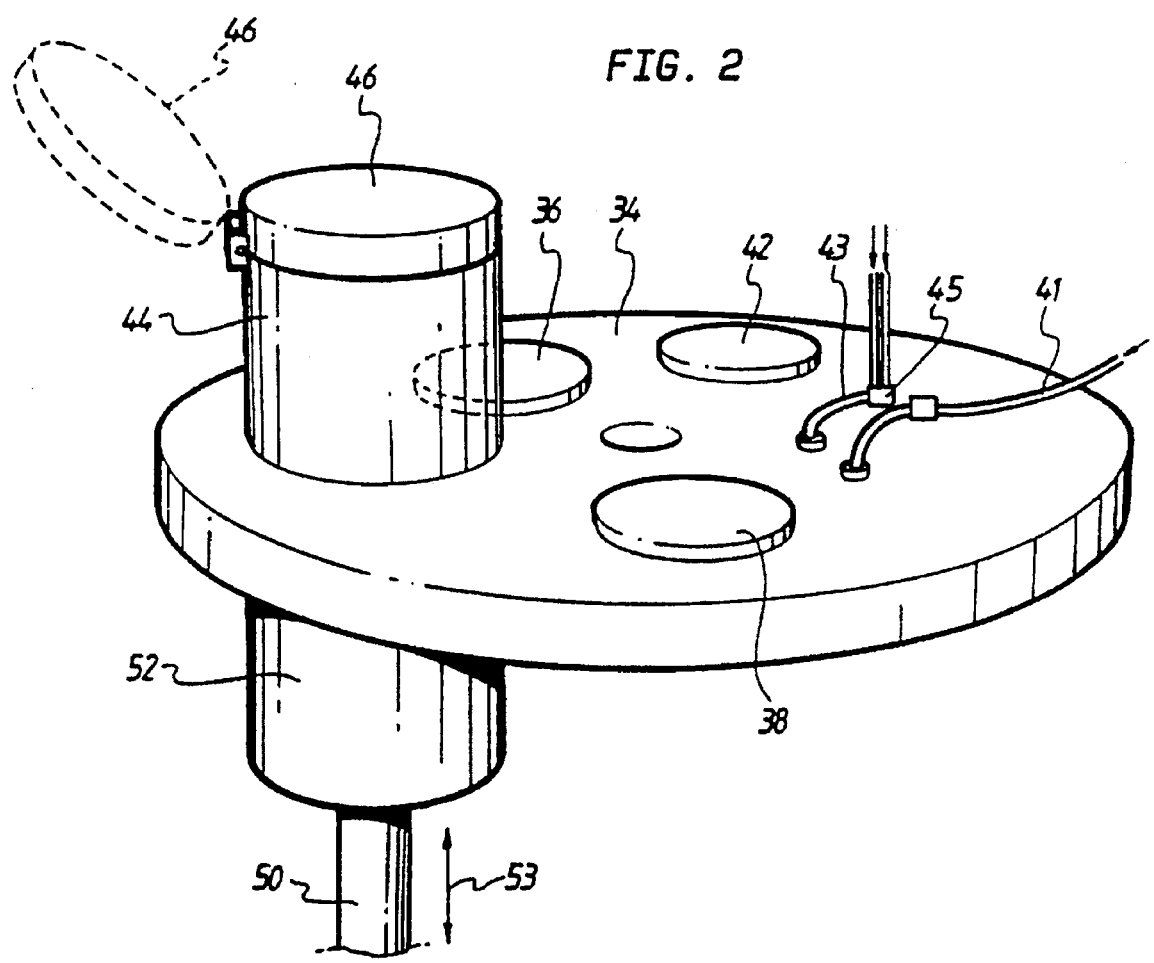
FIG. 2 is a perspective view showing the treatment chamber and lead lock device of the machine of FIG. 1.

Referring to the drawings, the IVD machine illustrated comprises an outer casing 10 having a partition 12 dividing the interior of the casing into a section 14 which has shelves on which are supported control units 16, 18, 20 and 22. In the other compartment 24 are contained the various operational components for effecting the drive and various displacements of the machine which will be as described hereinafter.

On the front of the machine are provided four operation buttons 26, 28, 30 and 32 whose function will be explained hereinafter, but it might be mentioned at this time that an advantage of this machine is that it is operated totally by the use of the said four buttons.

The casing 10 is of a height to enable adult persons to operate the machine in the manner to be hereinafter described.

On the top of the machine is a treatment chamber 34 which is shown in enlarged detail in FIG. 2, and the chamber 34 is in the form of a cylinder of diameter in the order of 75 cm, and of height in the order of 20 cm. The cylinder lies with its axis vertical, and on the top surface thereof are three magnetrons 36, 38 and 42 which operate typically in the manner of the sputtering apparatus described in British Patent No. 1453377 in that each is adapted to hold a target material capable of being sputtered. The magnetrons are of course connected to the control units 16 to 22 of the apparatus.

Figure 4:
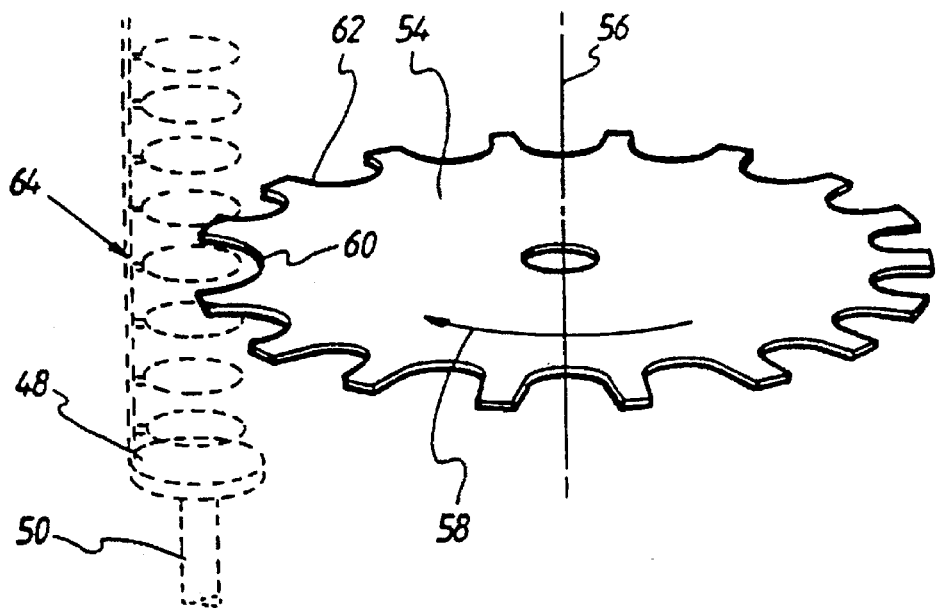
FIG. 4 is a perspective view showing the receiving disc which is contained in the treatment chamber, the view also illustrating the loading magazine.

Accessing the interior of the cylinder 34 is a load lock device comprising loading chamber cylinder 44 having a lid 46 which can be opened as shown in dotted lines in FIG. 2 to permit the loading thereinto of articles to be IVD treated. The base of the loading chamber 44 is defined by a sealing plate 48 which is shown in FIG. 4, so that the interior of the chamber 44 normally is isolated from the interior of the cylinder 34 when treatment is not taking place. The plate 48 is however attached to a displacement rod 50 which is moved by means of a stepping motor as will be hereinafter described so that the plate 48 is capable of being moved into a receiving chamber 52 to the underside of cylinder 34, and in alignment with the chamber 46. The possible movement of displacement rod 50 is indicated by arrow 53 in FIG. 2.

Inside the cylinder 34 and coaxial therewith is a rotatable disc 54 as shown in FIG. 4, the disc being rotatable about the axis 56 by a means not shown. The direction of rotation is indicated by arrow 58.

The disc 54 has scallops in its edge, namely a single large scallop 60 and a plurality of smaller but evenly spaced and similar sized scallops 62 which are for receiving holders each carrying a spectacle lens to be IVD treated in the cylinder 34.

Figure 5:
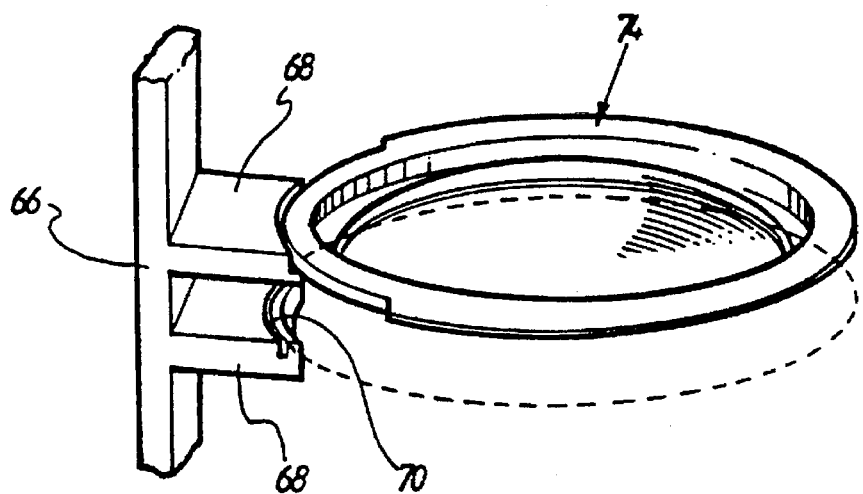
FIG. 5 is a perspective view showing a part of the loading magazine and a lens holder.
Figure 6:
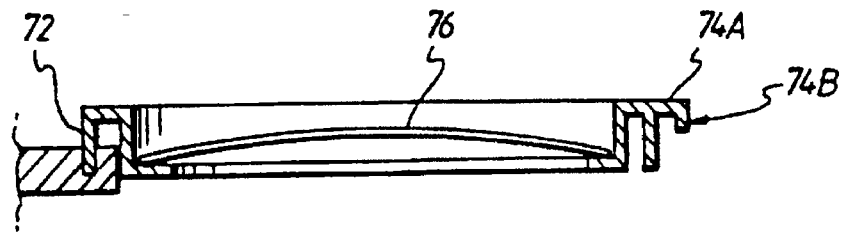
FIG. 6 is a sectional elevation of the arrangement shown in FIG. 5.

As shown in FIG. 4, the sealing plate 48 has supported thereon a magazine 64 which is in the form of a post 66 as shown in FIG. 5 provided with support shelves 68. Each support shelf 68 is provided with a groove 70 in which is received a downwardly turned flange 72 of a circular lens holder 74. FIG. 6 shows the profile of the lens holder, and in fact shows a lens 76 therein. The lens it is to be noted is positioned with its convex side facing upwards i.e. towards the magnetrons 36, 38 and 42. The lens holder 74 and the magazine 64 are arranged so that the lens holders can be positioned in the scallops 62 and when positioned therein, the center of the lens holder will travel on a pitch circle coinciding with the centers of the magnetrons 36, 38 and 42.

Figure 1:
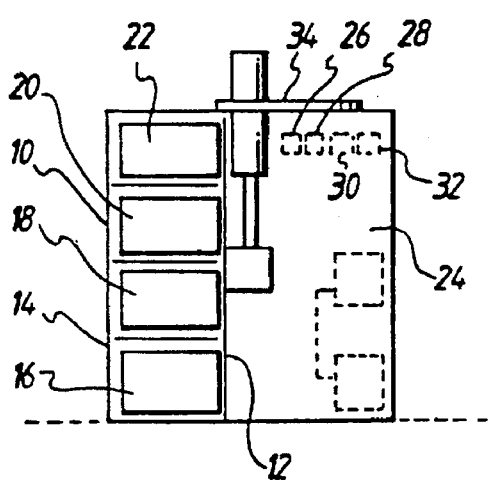
FIG. 1 is a sectional elevation of a machine according to the embodiment of the invention.
Figure 3:
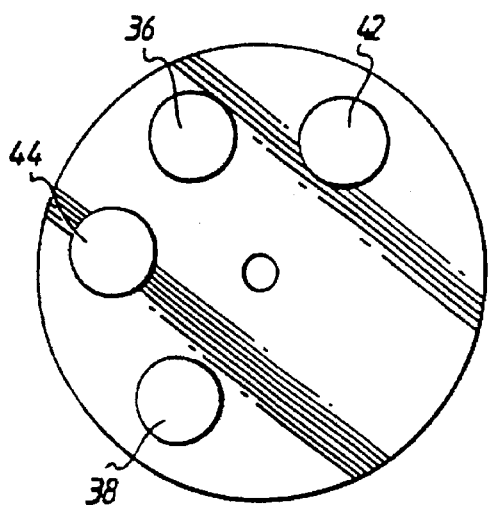
FIG. 3 is a plan view of the part of the apparatus shown in FIG. 2.

In order to load the machine with lenses such as lens 76 to be treated, the lenses are first placed in their holders 74, and then the holders are mounted on the mounting plates 68, and then the magazine is loaded to the loading chamber 44 in the correct position in relation to plate 48. In this connection, there will be a suitable registration means ensuring that the magazine is accurately positioned. At this time the disc 54 will be located so that the large scallop 60 is in register with the plate 48 which will in fact be above the disc plane. When the lenses have been thus positioned in the loading chamber 44, the loading operation of the machine is initiated, which as described hereinafter, comprises simply pressing of an appropriate button 26–32, as shown in FIG. 1.

After pressing of the appropriate button, operation is automatic as described herein with respect to FIGS. 4–6. In the loading operation, the plate 48 is lower stepping motor by a single step so that it lies under the plane of the disc 54, but so that the bottom lens holder 74 lies above the plane of the disc 54. The disc 58 is then stepped so that the first scallop 62 comes into register with the bottom holder 74 and stops. The plate 48 is then lowered by a further step which causes the holder 74 to be lifted from the support arm 68 by virtue, of flange 74A seating on the portion of the disc surrounding the appropriate scallop 62, and in this connection the disc may have a bead to engage behind the turned down edge 74B of flange 74A to retain the holder on the disc as it rotates in use. The disc steps by another pitch to bring the next scallop 62 into register with the next holder 74 on the magazine, following which the plate 48 is lowered by a further step thereby loading the next holder 74 and the lens therein onto the disc 54. The process repeats until all lens holders have been positioned on the scalloped disc, at which point the magazine will be lowered into the storage chamber 52.

The machine operates in that a vacuum is created inside the chamber of cylinder 34 by machine pumps which are similar in nature to those described in our co-pending patent application PCT/GB90/00195, and an ionising gas such as argon is introduced into the chamber 34 for example through connection 41 in FIG. 2. This vacuum is maintained at all times, and the condition is indicated by the illumination of a stand-by light. The chamber 44 must be evacuated to the same pressure as inside the chamber 34, before the sealing plate 48 is lowered to connect the interior of the loading chamber 44 with the interior of the cylinder 34. In this connection there preferably is an interlock microswitch connected to the lid 46 to ensure that the sealing plate 48 is not lowered until lid 46 is moved to the closed and sealed position, and the appropriate vacuum has been created inside the chamber 44. A separate vacuum pump may be provided for evacuating chamber 44.

The depression of the button to commence the loading operation also causes continued and automatic operation of the machine, and in this connection the appropriate button 26–32 would be indicated as convex, meaning convex side upward as related to the lens position in their holders (see FIG. 6).

After the lenses have been loaded, and in accordance with the programming of the machine, the disc 54 starts to spin until it reaches a speed of 50 rpm.

When it reaches this speed, argon is introduced into the chamber 34 and after a short pause oxygen is supplied to the magnetron 42 through inlet 43 (FIG. 2). There is a further short pause to enable the pressures to stabilise and then the DC power from one of the controllers 14 to 22 is supplied to the oxygen magnetron 42. Before actuating the other magentrons 36 and 38, the activation of the oxygen magnetron can be used for providing a plasma to provide a cleaning effect on the lenses prior to deposition of the sputtering material.

After this operation, or immediately if no oxygen cleaning effect is required, the magnetron 36 which for example may be provided with a titanium target is switched on so that the rotating lenses are subjected to titanium dioxide deposition. The oxygen supply to magnetron 42 is set to match the material being deposited and as magnetron 38 will in the normal circumstances deposit a second metal, so the oxygen control valve 45 (FIG. 2) controlling the supply of oxygen to the magnetron 42 has to be controlled depending upon the metal being deposited. In other words the oxygen supplied to megnetron 42 must match the material being deposited.

After a pre-set time, the oxygen valve is adjusted to provide a supply suitable for the deposition of the target material from magnetron 38, and the magnetron 36 is switched off, whilst magnetron 38 is switched on and the target material therein is sputtered. Typically such target material may be silicon, which is sputtered for a pre-set time period.

As each metal is deposited on the lens, it is quickly oxidised by the oxygen plasma provided by magnetron 42 as it must be remembered that the disc 54 is being rotated at the order of 50 rpm so that the appropriate metallic oxide is formed on the lens surface. The process is repeated for third and fourth cycles as appropriate, and during each cycle different amounts of titanium dioxide and silicon dioxide may be deposited. Typically, the thinner layers of oxide may be created in the initial cycles and in later cycles thicker layers may be created.

Typically for coating spectacle lenses, the following non limiting example is given.

Target materials: titanium (magnetron 36) silicon (magnetron 38)

Disc Speed: Titanium Dioxide deposit: 50 rpm Silicon Dioxide deposit: 50 rpm.

Deposited each pass: one atomic layer

Gas used for chamber 34. Argon

1st Stage: Titanium dioxide deposit

Time: sufficient to deposit 10 mm $TiO_2$

2nd Stage: Silicon dioxide deposit

Time: sufficient to deposit 30 mm $SiO_2$

3rd Stage: Titanium dioxide deposit
  Time: sufficient to deposit 110 mm $TiO_2$
4th Stage: Silicon dioxide deposit
  Time: sufficient to deposit 90 mm $SiO_2$ When the requisite number of cycles have been completed, the apparatus automatically moves to a rest position wherein no magnetron is energised. The disc 54 seeks a home position, and the magazine 64 is progressively raised with progressive stepping of the disc 54 so that the holders 74 are re-loaded into the magazine until the plate 48 moves once again into position sealing the lower end of loading chamber 44. When this position has been reached, the lid 46 can be raised to provide access to the chamber 44 for the removal of the magazine 64 and the treated lenses. Chamber 44 may be arranged to be vented before the lid 46 can be raised, signalling the end of the coating operation. The magazine and the treated lenses are removed by hand, and the lenses are inverted and re-positioned in the magazine 64 so that the concave sides face upwards, and the magazine is re-positioned in the chamber 44 which is again closed, and the machine is operated for the treatment of the opposite sides of the lenses by the depression of one of the buttons on the front of the machine which is marked "concave" and the machine repeats these steps indicated above except that the treatment periods are adjusted accordingly because the concave surfaces of the lenses will be located a further distance from the magnetrons than the convex sides.

Figure 12:
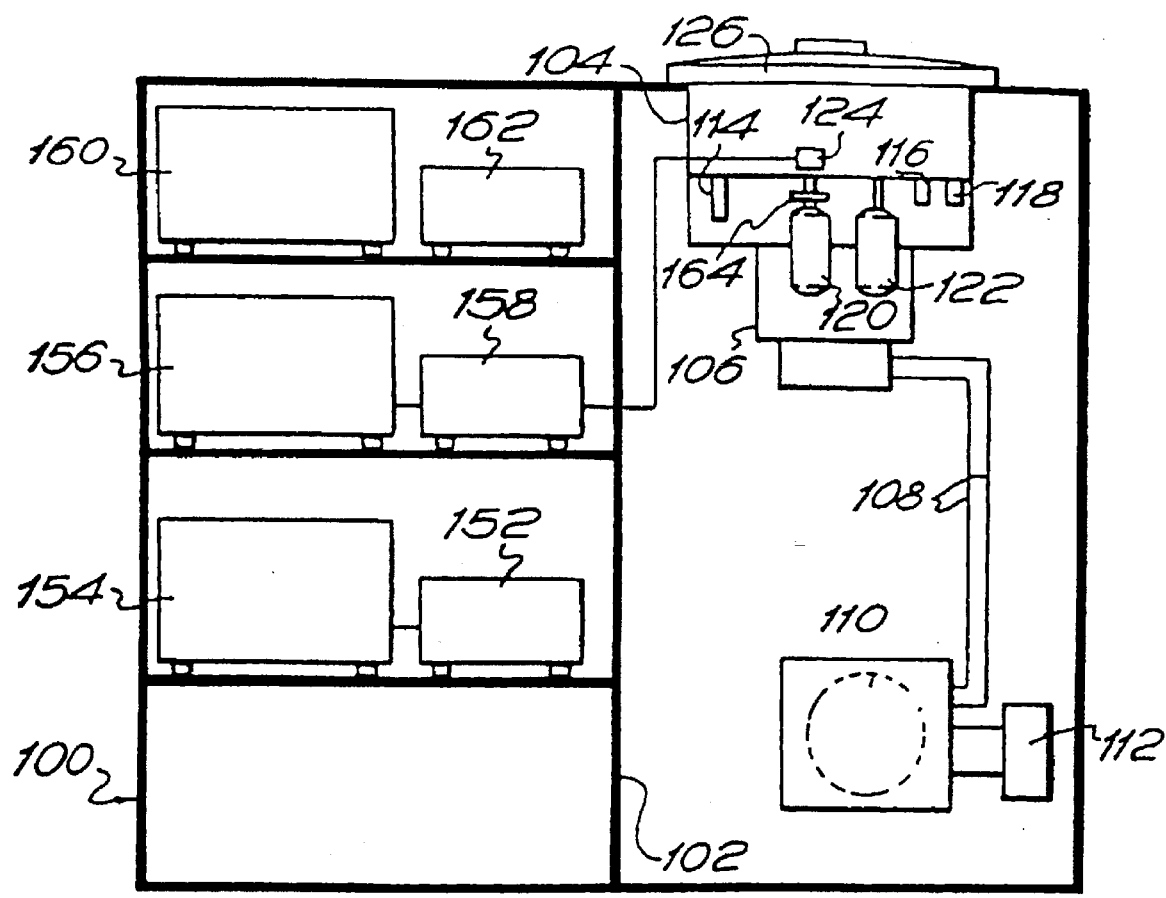
FIG. 12 is a side elevation of an embodiment of the invention which is useful in describing automated operation.

As to the means and method for the automatic control of the machine, reference is made to the specification PCT/GB90/00195. In accordance with that reference, a machine shown cross-sectionally in FIG. 12 has a casing 100 which is divided vertically by a partition 102. The casing may typically be approximately 1.25 m in height and in width, and it may typically be 0.75 meter in depth. These dimensions illustrate that this machine is smaller than conventional machines for carrying out the same process.

In the left hand side of the cabinet there are provided shelves for supporting various control units, including a radio frequency power, unit 152 for powering the magnetrons (not shown in this figure). Unit 154 is a means for altering the d.c. power unit, and this tuner may be operated manually or under automatic control.

A programmer 156 is provided whereby the machine can be programmed to coat the lenses to a predetermined extent and in a predetermined manner. The programmer is associated with a control alarm unit 158. Units 156 and 158 are coupled to an oscillator 124 for detection and automatic control. A drive unit 160 drives a tubo molecular pump 106. Pressure recording unit 162 records the pressure in chamber 104.

In use, with the pumps off, lid 126 is opened and a plate (not shown in this figure) bearing the lenses to be coated is loaded into the machine. Programmer 156 is programmed to give a preset sequence of coating operations, and then the machine is ready to be started. Lid 126 is closed and forms an air tight seal with the remainder of the chamber. Pumps 106 and 110 are then switched on in order to evacuate chamber 104 to a predetermined vacuum level. In this embodiment of the invention, a required vacuum of $10^{-5}$ torr is achieved in approximately in 12 minutes. When the correct vacuum has been achieved, the ionizing gas is introduced into the chamber and a weak discharge is created in the chamber and around the lenses to provide a plasma which in fact bombards the lenses and cleans same. This plasma is generated in response to an electrical bias. After a predetermined period, the etching process is terminated. In some embodiments, the lenses are cleaned prior to being placed in the chamber using a cleaning fluid such as IPA (isopropyl alcohol).

After the initial cleaning step has been completed, the magnetrons are powered. The lens holder continues to be electrically biased whilst the magnetrons are powered and the exposed target starts to sputter. A first layer is thereby deposited on the lenses. When the thickness of the first layer reaches a predetermined value, as determined by the programming and as detected by the oscillator, the process may be repeated. As many layers of the respective targets and in any particular order can be deposited. The controller for positioning the shield (not shown in this figure) is an optical controller 164 carried by the shaft of a motor 120.

At the end of the process, which is automatically controlled by the programmer 156, the power to the magnetrons is automatically switched off, and the chamber is vented to atmosphere. The venting rate may be controlled, and therefore the machine may be require to remain closed for a few minutes before the lid 126 can be opened.

The use of the oscillator to monitor the sputtering rate results in reliable control over the thickness of each layer deposited. It is therefore not necessary to examine visually the sputtering, as is often the case in a conventional IVD apparatus.

The machine has two DC power supplies for driving the oxygen magnetron 42 on the one hand, and the respective target material magnetrons 36 and 38 on the other hand. The power for the magnetrons 36 and 38 is much greater than that required for the magnetron 42, because in the case of the magnetron 42 it is necessary only to provide an oxygen plasma for the oxidation stage. This plasma contains positive and negative ions, as well as neutrals, $O,O_2$ excited, $O_2$, O excited, and O and $O_2$ ions, same or all of which cause the oxidation.

It is of advantage to use a loading chamber 44 because the main cylinder 34 can be maintained at a low vacuum pressure at all times, which keeps the target materials in best condition in that the contaminants are prevented from reaching the target materials. This enables the machine to be operated in a manner requiring only depression of a start sequence button. By arranging for the chamber 34 to be maintained at a lower pressure at all times, the waiting time which would be required if the main chamber had to be evacuated for each operation, is avoided.

The vacuum loading chamber 44 will preferably be associated with the pressure gauge to ensure that the plate 48 is not moved downwards from its sealing position until the pressure inside the Chamber 44 is equal to that inside chamber 34.

The configuration of the holders and/or disc may be varied and in one variation the lenses are held in the holders by spider type springs, the legs of which engage the edges only of the lenses to keep the lenses suspended clear of the holders, avoiding any contact with the surfaces to be coated. In another variation, the disc 54 and the holders are of the configuration shown in FIGS. 7 to 11.

Figure 7:
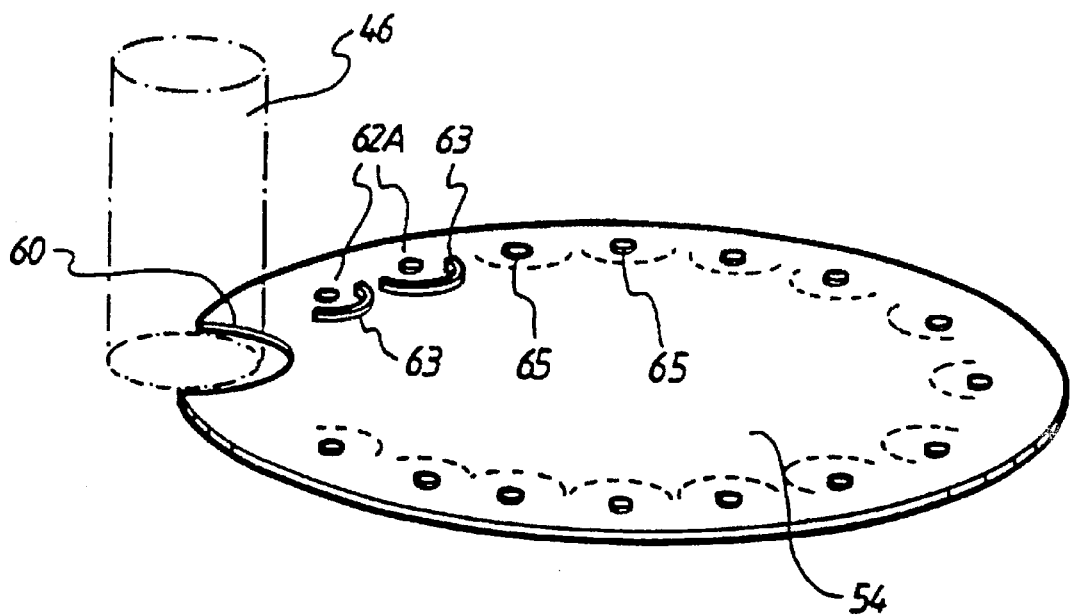
FIG. 7 is a perspective view similar to FIG. 4, but showing an alternative embodiment.
Figure 8:
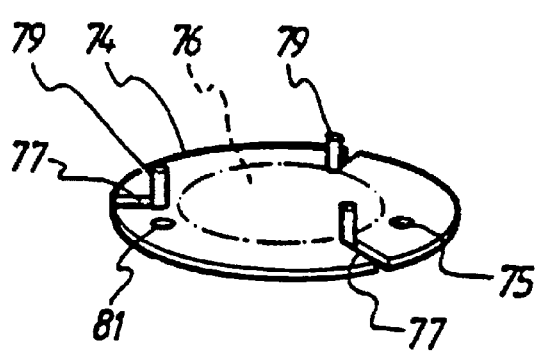
FIG. 8 is a perspective view of a lens holder for use with the disc shown in FIG. 7.

Referring to these figures, in FIG. 7 it will be seen that the disc 54 is provided only with the single large scallop 60, and in place of the scallop 62 are provided location zones 62A, each defined by an arcuate wall 63 and a location peg 65, arranged as shown.

The relationship of the loading cylinder 44 with the disc 54 is as described in relation to FIG. 4, and the loading procedure is similar, but the holders 74 in the FIGS. 8 to 11 arrangement comprise essentially flat metal discs. Each disc 74 has a registration hole 75 for receipt of an appropriate location pin 65 when the holder is positioned on the disc, and additionally, the holder plate 74 is provided with three equiangularly spaced slots 77 in which are located lens retention pins 79 which are adjustable radially relative to the holder plate 74, by means not shown. Such means may comprise for example a screw threaded bar located to the underside of the plate 74. These pins serve to hold a lens 76 which is positioned on the holder plate 74 for receiving the treatment hereinbefore described.

Finally the plate 76 has means enabling it to be engaged by and held by the support arm 68 of the magazine loading mechanism. Such means may comprise apertures 81 for receiving appropriate pins on the arm 68.

Figure 10:
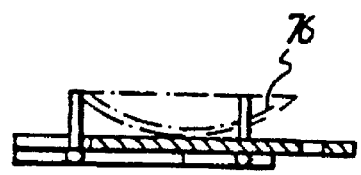
FIGS. 9 and 10 are sectional views of the holder shown in FIG. 8, when holding the lens concave side up and convex side up respectively.
Figure 9:
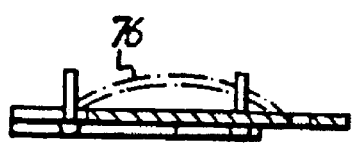

FIGS. 9 and 10 show that the lens 76 can be placed convex side upwards or concave side upwards to enable beth sides of the lens to be treated as hereinbefore described.

The advantage of using a flat plate as described with radially adjustable holding pin 79 is that the lens is not located in a well or recess as it is in the arrangement of FIG. 6. It has been found that by providing a holder as shown in FIG. 6, it sometimes happens that the peripheral edge region of the lens surface remains untreated following the treatment operation, because the wall of the cavity or recess acts as a shadow preventing impingement on the peripheral edge of the lens of the coating material. This would also not take place when the spider springs as described hereinbefore are used.

Secondly, by the alternative arrangements described it is possible to grip and hold lenses which are of a non-circular shape and plan view. In other words it is possible to treat the lenses after they have been shaped to fit specific spectacle frames.

Figure 11:
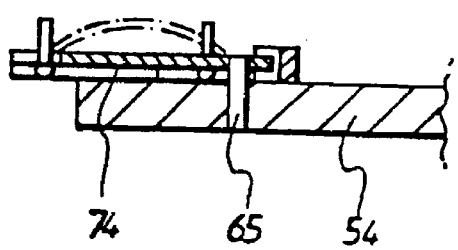
FIG. 11 is a sectional view of an edge of the disc of FIG. 7, with a lens holder located thereon.

The loading and treatment operation are essentially as described in relation to the previous figures, although FIG. 11 does show how a holder plate 74 is received on the disc 54 at an appropriate location 62A. The location pin 65 locates in the receiving aperture 75, and the arcuate wall 63 is neatly shaped to the edge of the plate 74 so that when the disc 54 is rotated at the relatively high speed of 50 rpm, the holders 74 remain securely in position, and when rotation of the disc has terminated and the holders 74 are removed from plate 54, the pins on the magazine mechanism arm 68 will accurately engage in holes 81 and lift the individual holder plates from the disc 54.

Reference has been made hereinbefore to the use of titanium and silicon targets, but it is to be mentioned that targets of any suitable materials such as tantalum, indium, tin, gold and mixtures of these maybe used.

Also, although the description hereinbefore suggests that the target materials are sputtered alternately, it is possible in some arrangements to provide for simultaneous sputtering targets of different materials.

The oxygen may be supplied to the oxygen magnetron 42 through either of two valves for the achievement of different partial pressures of the oxygen depending upon the materials being sputtered. A gas, flow controller may be fitted to ensure the automatic supply of oxygen as related to the material being sputtered.

The oxygen magnetron 42 uses a target of titanium or carbon or the like driven at a low power as its purpose simply is to create a plasma of oxygen for providing the oxydation referred to herein.

The chamber 34 may be provided with a viewing window whereby the IVD process going on inside the chamber can be viewed. Such a viewing window may not be necessary especially when the process is carried out under automatic control, or if the chamber is constructed from glass, which is a possible embodiment of the invention.

There may be provided within the chamber an electron source in the form of a hot wire filament under positively biased probe. The use of this filament and probe can raise the ionisation efficiency of the system.

As set forth in said PCT application, the chamber 34 may be evacuated using a turbo molecular pump in series with a rotary pump.

Each magnetron may be as disclosed in said PCT application, and/or as disclosed British Patent 1,453,377, except that the target material faces downwardly into the chamber 34.

Argon is the gas mainly used for the chamber to create the discharge and sputtering. However, for reactive coating, argon reactive gas mixtures are used to provide the required reaction.

It will be appreciated that appropriate electrical insulation will be provided in order to ensure the electrical effects. For example the drive shaft which rotates the disc 54 will be appropriately insulated.

As described in said PCT application, the control of the time period during which sputtering and deposition is taking place in relation to the respective targets, may be pre-programmed and then controlled automatically for example by utilisation of an oscillator to monitor the sputtering rate. Indeed, any of the features disclosed in said PCT application may be used in conjunction with the embodiment of the present invention.

As in the invention disclosed in said PCT application, the embodiment of the present invention has many advantages including but not limited to the following:

1. Uniform and adherent multi-layered anti-reflection coatings can be deposited on both sides of glass or plastic lenses.
2. Many thin layers can be deposited without interrupting the process.
3. By using thermionically assisted triode discharge it is possible to operate at low gas base pressure thus making the process more efficient and less expensive in terms of gas consumption.
4. It is possible to control independently the lens holder bias, gas pressure, reactive gasses pressure and discharge current density.
5. Different reactive gases could be employed to deposit various layers including "hard diamond" coating which is a carbon coating having n hardness similar to that of diamond.
6. Dense coating can be achieved by increasing the ionisation efficiency and lowering the gas pressure.
7. Metals, semi-conductors and insulators could be sputtered using the process.
8. A uniform coating is created on a non uniform shape i.e. curved lens.

Although the invention has been described in terms of specific embodiments and applications, persons skilled in the art can, in light of this teaching, generate additional embodiments without exceeding the scope or departing from the spirit of the claimed invention. Accordingly, it is to be understood that the drawing and description in this disclosure are proffered to facilitate comprehension of the invention, and should not be construed to limit the scope thereof.

We claim:

1. A sputtering apparatus for coating multilayered coatings on batches of lenses by depositing sputtered metal thereon and reacting the metal to form a coating of required composition while preventing contaminants from reaching the sputtering apparatus, said apparatus comprising;

a chamber;

means for creating a vacuum in said chamber;

a load lock device communicating with said chamber, said load lock device including;

a magazine for holding lens holders with the lenses to be coated thereon, means for isolating the load lock device from the chamber;

means for creating a vacuum in the load lock device;

means for releasing said means for isolating when the lens holders and the lenses have been loaded into said magazine of said load lock device and a vacuum has been created therein;

a holder for holding the lens holders with the lenses; and means for enabling each of the lens holders and the lenses to be respectively placed in a means for receiving and holding a plurality of holder at the periphery thereof, said means for and receiving a plurality holding lens holders, said holder being mounted for rotation in said chamber;

drive means coupled to said means for receiving and holding a plurality of lens holders for rotating said means for receiving and holding a plurality of lens holders continuously during operation of the apparatus;

sputtering apparatus in said chamber; said sputtering apparatus being provided with;

a first magnetron having a metal target to be sputtered to define a metal deposition zone in the chamber; and means for creating a reaction of the sputtered metal defining a reaction zone in the chamber; and programmable control means arranged to cause the sputtering apparatus to operate in accordance with a programmed sequence, whereby said chamber is held in vacuum and said sputtering apparatus with the first magnetron and said means for creating a reaction are continuously exposed to said chamber throughout and between the operation of the apparatus for coating the lenses, said load lock device allowing introduction or removal of batches of lenses into or from said chamber under vacuum to prevent contaminants from reaching said first magnetron and said means for creating a reaction, and thereby allowing the sputtering and reaction of material on the lenses to create the multilayered coating to commence immediately upon the operation of the sputtering or reaction producing means in the chamber.

2. The apparatus of claim 1 wherein said sputtering apparatus further comprises a second magnetron, said second magnetron having a metal target of a second metal to create a multilayered coating of more than one layer.

3. The apparatus of claim 2 wherein said means for creating a reaction comprises a third magnetron arranged to establish a plasma in said chamber during the sputtering of the first or second magnetrons for ensuring that a reacted coating of at least one of said first or second target materials is deposited.

4. A method of sputter coating batches of ophthalmic lenses, the method comprising the steps of:

creating a vacuum in a sputtering chamber containing;

a rotatable holder on which the lenses are to be placed;

at least a first magnetron with a metal target for sputtering metal; and a reaction producing means;

loading a first batch of lenses in lens holders into a load look device while it is isolated from the sputtering chamber;

creating a vacuum in the load lock device;

connecting the load lock device with the chamber when the vacuum of the load lock device is achieved;

placing the lens holders and lenses on said rotatable holder and holding a lens holder at the periphery thereof in a stepwise manner;

starting operation of the rotatable holder to rotate the rotatable holder continuously;

starting operation of the first magnetron whereupon at least one metal target is sputtered to cause a coating to deposit on the lenses;

operating a second magnetron during rotation of the rotatable holder to create a reaction of the metal deposited on the lenses;

stopping the sputtering and the rotating of the rotatable holder when the coating on the lenses is formed;

returning the lens holders and coated lenses to the load lock device under vacuum until the batch of lenses is unloaded;

isolating the load lock device from the chamber;

removing the lens holders and lenses from the load lock device; and wherein the process is repeated for each batch of the lenses, and the forming of the coating on the lenses commences immediately upon operation of the sputtering application of metal or production of the reaction.

5. The method of claim 4 wherein there are provided the further steps of: reversing the lenses of the batch of lenses to expose a second surface thereof; and placing the batch of reversed lenses into the chamber as a further batch of lenses to be coated.

\* \* \* \* \*

UNITED STATES PATENT AND TRADEMARK OFFICE
CERTIFICATE OF CORRECTION

PATENT NO. : 5,660,693
DATED : August 26, 1997
INVENTOR(S) : Abramson, *et al.*

It is certified that error appears in the above-indentified patent and that said Letters Patent is hereby corrected as shown below:

Title page, Item [63] change "90,027" to -- 90,028 --.

Col. 2, line 21, change "magnetrons" to -- magnetron --;

Col. 2, line 24, change "lead" to -- load --;

Col. 2, line 25, change "lead" to -- load --;

Col. 2, line 26, change "lead" to -- load --;

Col. 2, line 28, change "lead" to -- load --;

Col. 2, line 29, change "lead" to -- load --;

Col. 2, line 35, change "lead" to -- load --;

Col. 2, line 37, change "on" to -- one -- and "magnetrons" to -- magnetron --;

Col. 3, line 67, change "lead" to -- load --;

Col. 5, line 38, change "lower" to -- lowered by --;

Col. 6, line 23, change "magentrons" to -- magnetrons --;

Col. 6, line 37, change "megnetron" to -- magnetron --;

Col. 7, line 48, change "tubo" to -- turbo --;

UNITED STATES PATENT AND TRADEMARK OFFICE
CERTIFICATE OF CORRECTION

PATENT NO.   :   5,660,693
DATED        :   August 26, 1997
INVENTOR(S)  :   Abramson, *et al.*

It is certified that error appears in the above-indentified patent and that said Letters Patent is hereby corrected as shown below:

Col. 7, line 55, change "dosed" to -- closed --;

Col. 8, line 18, change "require" to -- required --;

Col. 9, line 14, change "beth" to -- both --;

Col. 9, line 47, change "maybe" to -- may be --;

Col. 10, line 8, after "disclosed" insert -- in --;

Col. 10, line 45, change "n" to -- a --; and

Claim 4, line 15, change "look" to lock.

Signed and Sealed this

Thirteenth Day of April, 1999

Attest:

Q. TODD DICKINSON

Attesting Officer

Acting Commissioner of Patents and Trademarks